(12) United States Patent
Rodriguez et al.

(10) Patent No.: US 9,945,907 B2
(45) Date of Patent: Apr. 17, 2018

(54) METHOD AND SYSTEM FOR DETERMINING A SYNCHRONOUS MACHINE FAULT CONDITION

(71) Applicant: ABB Schweiz AG, Baden (CH)

(72) Inventors: Pedro Rodriguez, Västerås (SE); Subrat Sahoo, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/124,948

(22) PCT Filed: Mar. 4, 2015

(86) PCT No.: PCT/EP2015/054465
§ 371 (c)(1),
(2) Date: Sep. 9, 2016

(87) PCT Pub. No.: WO2015/135804
PCT Pub. Date: Sep. 17, 2015

(65) Prior Publication Data
US 2017/0016960 A1  Jan. 19, 2017

(30) Foreign Application Priority Data
Mar. 11, 2014  (EP) .................................. 14158820

(51) Int. Cl.
G01R 31/34 (2006.01)
H02P 29/024 (2016.01)

(52) U.S. Cl.
CPC ........... G01R 31/34 (2013.01); G01R 31/343 (2013.01); H02P 29/0241 (2016.02)

(58) Field of Classification Search
CPC .... G01R 31/34; G01R 31/343; H02P 29/0241
(Continued)

(56) References Cited

U.S. PATENT DOCUMENTS 4,492,999 A * 1/1985 Amagasa ............. G01R 31/343
322/29
4,761,703 A  8/1988 Kliman et al.
(Continued)

FOREIGN PATENT DOCUMENTS

CN  1344941 A  4/2002
CN  101694508 B  8/2011
(Continued)

OTHER PUBLICATIONS

International Search Report & Written Opinion of the International Searching Authority Application No. PCT/EP2015/054465, Completed: Apr. 29, 2015; dated May 11, 2015, 14 pages.
(Continued)

*Primary Examiner* — Melissa Koval
*Assistant Examiner* — Trung Nguyen
(74) *Attorney, Agent, or Firm* — Whitmyer IP Group LLC

(57) ABSTRACT

A method of determining a fault condition in a synchronous machine. The method includes a) obtaining a field current signal and a shaft voltage signal of the synchronous machine, b) transforming the field current signal and the shaft voltage signal to obtain a field current frequency spectrum and a shaft voltage frequency spectrum, and c) determining whether a fault condition is present, and in case a fault condition is present identifying a type of the fault condition, based on harmonic content of the field current frequency spectrum and harmonic content of the shaft voltage frequency spectrum, wherein c) includes comparing the harmonic content of the field current frequency spectrum with fault condition field current signature spectra and comparing the harmonic content of the shaft voltage frequency spectrum with fault condition shaft voltage signature spectra.

12 Claims, 3 Drawing Sheets

(58) Field of Classification Search
USPC ....... 324/200, 207.2, 117 H, 207.13, 207.14, 324/207.22, 219–241, 248–255, 378, 389, 324/207.21, 244
See application file for complete search history.

(56) References Cited

U.S. PATENT DOCUMENTS

| | | |
|---|---|---|
| 5,032,826 A | 7/1991 | Miller |
| 6,757,665 B1 | 6/2004 | Unsworth et al. |
| 2009/0091289 A1 | 4/2009 | Nandi et al. |
| 2011/0234181 A1 | 9/2011 | Hobelsberger et al. |

FOREIGN PATENT DOCUMENTS

| | | |
|---|---|---|
| CN | 202334223 U | 7/2012 |
| JP | H03195387 A | 8/1991 |

OTHER PUBLICATIONS

Wesley Doorsamy et al: "Multiple fault diagnosis on a synchronous 2 pole generator using shaft and flux probe signals", Industrial Technology (ICIT), 2013 IEEE International Conference on, IEEE, Feb. 25, 2013, pp. 362-367.

\* cited by examiner

METHOD AND SYSTEM FOR DETERMINING A SYNCHRONOUS MACHINE FAULT CONDITION

TECHNICAL FIELD

The present disclosure generally relates to synchronous machines. In particular, it relates to a method of determining whether a fault condition is present in a synchronous machine, and in case a fault condition is present, identifying the type of fault condition. Furthermore, this disclosure also relates to a synchronous machine fault condition monitoring system which implements the method.

BACKGROUND

Synchronous machines, i.e. synchronous motors and synchronous generators, comprise a rotor and a stator. The rotor and stator interact electromagnetically such that rotation of the rotor is obtained in case the synchronous machine is a motor, and such that current is induced in the stator coil in case the synchronous machine is a generator.

A number of fault conditions may occur in a synchronous machine, both in the stator and in the rotor. Such fault conditions may instantaneously introduce noticeable deviations in behaviour of the synchronous machine, or they may go unnoticed for a longer period of time, which only after months or even years manifests itself in a catastrophic breakdown.

Traditionally, stator current and synchronous machine vibration measurements have been preferred monitoring methods for determining the presence of a fault condition. Stator current measurements must however be performed under the high voltage conditions of the stator, which therefore requires expensive sensor equipment able to withstand such conditions. Furthermore, it has been shown that vibration levels do not reflect synchronous machine conditions in a satisfactory manner.

US20090091289 discloses a fault detection system using field current, i.e. rotor current, and rotor search coil voltage harmonics. The method involves collecting a synchronous machine field current, for example, and predicting a harmonic frequency based on the field current. The predicted harmonic frequency is monitored to determine a status of the stator based on current and voltage. A stator inter-turn fault is detected based on the monitoring of the predicted harmonic frequency, where a ratio of the harmonic frequency to a line frequency is equal to a specific equation. The harmonic frequency is predicted based on a number of fundamental poles of the machine.

US 20090091289 hence provides monitoring and determination of stator inter-turn faults utilising field current measurements. There are however a plurality of possible fault conditions which may arise in a synchronous machine.

U.S. Pat. No. 4,492,999 A discloses a supervisory unit for detecting abnormalities in shaft voltage of rotary electrical machinery and apparatus such as brushless synchronous machines. The supervisory unit includes a first detector for detecting the voltage across at least two points of the rotor shaft, a second detector for detecting the voltage between the rotor shaft and ground, and a third detector for detecting an electrical condition of an AC exciter which constitutes part of the field system of the apparatus. The third detector may detect electrical signals indicative of the field system voltage or the field system current. The supervisory unit includes a voltage comparator and a frequency comparator which receive detection signals from the three detectors to provide a signal indicating abnormality when an abnormal condition occurs, such as contact failure of a grounding brush or a failure in coil insulation.

The paper Wesley Doorsamy et al: "Multiple fault diagnosis on a synchronous 2 pole generator using shaft and flux probe signals", Industrial Technology (ICIT), 2013 IEEE International Conference ON, IEEE, 25 Feb. 2013, pp. 362-367, discloses a method for diagnosis of multiple incipient faults on a 2-pole synchronous generator is presented. Simulation of the generator on a finite element analysis (FEA) software package is used to predict the effects of these faults. Experimental analysis of the generator under fault conditions is then conducted and confirms the predicted behaviour. The investigation utilises shaft brushes as a non-invasive condition monitoring tool and search coils are used to validate findings from the shaft signal analysis. Results of the investigation indicate definitive relationships between the faults and specific harmonics of the output signals from the condition monitoring tools.

SUMMARY

In view of the above, an object of the present disclosure is to provide a method and a system which provides improved fault condition detection and fault condition type determination than what has previously been possible.

Hence, according to a first aspect of the present disclosure there is provided a method of determining a fault condition in a synchronous machine, wherein the method comprises:

obtaining a field current signal and a shaft voltage signal of the synchronous machine, transforming the field current signal and the shaft voltage signal to obtain a field current frequency spectrum and a shaft voltage frequency spectrum, and determining whether a fault condition is present, and in case a fault condition is present identifying a type of the fault condition, wherein the determining is based on harmonic content of the field current frequency spectrum and harmonic content of the shaft voltage frequency spectrum.

An effect which may be obtainable by utilising different fault condition indicators, i.e. field current and shaft voltage, is that multiple fault conditions may be detected and identified. Furthermore, fault conditions which would not be possible to identify by analysis of only one of the field current frequency spectrum and the shaft voltage frequency spectrum may be determined. In particular, for some faults there is no unique signature spectrum for the field current frequency spectrum or the shaft voltage frequency spectrum. Evaluation of the field current frequency spectrum and the shaft voltage frequency spectrum can thus be utilised synergistically to discriminate more accurately amongst different fault conditions.

Moreover, utilisation of different fault indicators enables detection of simultaneous fault detection in case, several fault conditions are present simultaneously.

According to one embodiment step c) comprises comparing the harmonic content of the field current frequency spectrum with a healthy condition field current signature spectrum and the harmonic content of the shaft voltage frequency spectrum with a healthy condition shaft voltage signature spectrum.

In case the harmonic content of the field current frequency spectrum does not match the healthy condition field current signature spectrum or the harmonic content of the shaft voltage frequency spectrum does not match the healthy condition shaft voltage signature spectrum step c) comprises comparing the harmonic content of the field current frequency spectrum with fault condition field current signature spectra and comparing the harmonic content of the shaft voltage frequency spectrum with fault condition shaft voltage signature spectra.

According to one embodiment, in step c) identification of the type of fault condition is further based on the amplitude of frequency components of the harmonic content of the field current frequency spectrum and the shaft voltage frequency spectrum.

One embodiment comprises evaluating the field current frequency spectrum whether frequency components at 2n*fs are present, where n is an integer and fs is a supply frequency.

One embodiment comprises determining whether frequency components at 2n*fs are present beyond the 6th harmonic to determine that a rotor has a shorted turn fault condition.

One embodiment comprises evaluating the shaft voltage frequency spectrum whether frequency components at (2n+1)*fs±fr are present, where fr is a rotational frequency of a rotor of the synchronous machine.

One embodiment comprises determining that a stator has a shorted turn in case the frequency components 2n*fs of the field current frequency spectrum are distributed in the entire spectrum and if frequency components at (2n+1)*fs±fr in the shaft voltage frequency spectrum are present.

One embodiment comprises determining that a static eccentricity fault condition is present in case the frequency components 2n*fs of the current voltage frequency spectrum are restricted to about the 6th harmonic and if frequency components at (2n+1)*fs±fr in shaft voltage frequency spectrum are present.

One embodiment comprises evaluating the field current frequency spectrum whether frequency components at n*fr are present, where n is an integer and fr is a rotational frequency of a rotor of the synchronous machine, to determine whether a static and dynamic eccentricity fault condition is present.

One embodiment comprises evaluating the field current frequency spectrum whether frequency components at n*fs are present, and evaluating the shaft voltage frequency spectrum whether frequency components at n*fs are present where n is an integer and fs is a supply frequency, to determine whether a rotor has a shorted turn fault condition or whether a dynamic eccentricity fault condition is present.

One embodiment comprises obtaining the field current signal from a field current sensor and the shaft voltage signal from a shaft voltage sensor.

One embodiment comprises obtaining a temperature of a rotor of the synchronous machine, and estimating a lifetime of the rotor based on the harmonic content of the field current frequency spectrum, the shaft voltage frequency spectrum and the temperature.

According to a second aspect of the present disclosure there is provided a computer program product comprising computer-executable components for causing a synchronous machine fault condition monitoring system to perform the method according to the first aspect presented herein when the computer-executable components are run on processor circuitry of the synchronous machine fault condition monitoring system.

According to a third aspect of the present disclosure there is provided a synchronous machine fault condition monitoring system comprising: a field current sensor arranged to measure a field current of a synchronous machine, a shaft voltage sensor arranged to measure a shaft voltage of a synchronous machine, processor circuitry arranged to receive a field current signal from the field current sensor and a shaft voltage signal from the shaft voltage sensor, and a storage unit storing instructions that, when executed by the processor circuitry causes the synchronous machine fault condition monitoring system to perform the method according to the first aspect presented herein.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise. Moreover, any steps of the method presented herein need not necessarily be performed in the described order, unless explicitly stated so.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1:
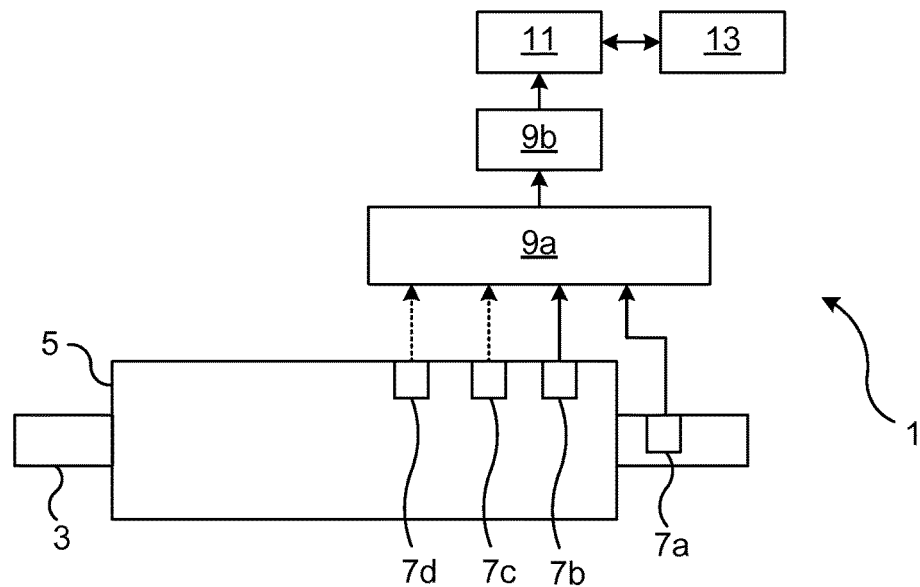
FIG. 1 schematically depicts an example of a synchronous machine fault condition monitoring system.

FIG. 1 depicts an example of a synchronous machine fault condition monitoring system 1. The synchronous machine fault condition monitoring system 1 is arranged to detect and identify a fault condition of a synchronous machine, i.e. a motor or a generator.

A synchronous machine comprises a shaft 3, a rotor 5 arranged around the shaft 3, and a stator, not shown, housing the rotor 5 for electromagnetic interaction with the stator via rotational motion. The synchronous machine may be a low voltage machine, a medium voltage machine or a high voltage machine.

The synchronous machine fault condition monitoring system 1 is arranged to obtain electrical parameters associated with the rotor and the shaft, to perform a frequency analysis of the harmonic components of the frequency spectra of the electrical parameters, and based on the harmonic components determine whether a fault condition is present in the synchronous machine, and to identify the type of fault condition.

The synchronous machine fault condition monitoring system 1 comprises a shaft voltage sensor 7a arranged to measure a shaft voltage associated with the shaft 3, and a field current sensor 7b arranged to measure a field current of the rotor 5. Field current is current flowing through a rotor coil.

The synchronous machine fault condition monitoring system 1 further comprises a transmitter 9a, a receiver 9b, processor circuitry 11 and a storage unit 13. The transmitter 9a is configured to receive electrical parameter signals, i.e. shaft voltage signals and field current signals, from the shaft voltage sensor 7a and the field current sensor 7b respectively. The transmitter 9a is further configured to transmit the electrical parameter signals to the receiver 9b. Signal transmission between the transmitter 9a and the receiver 9b may be wireless of wired, or a combination thereof.

The processor circuitry 11 is arranged to obtain the electrical parameter signals from the receiver 9b. The storage unit 13 stores instructions or computer-executable components that, when executed by the processor circuitry 11 causes the synchronous machine fault condition monitoring system 1 to perform the method presented herein. The processor circuitry 11 is thus arranged to transform the field current signal and the shaft voltage signal to obtain a field current frequency spectrum and a shaft voltage frequency spectrum. The transformation may for example be Fourier transformation or any other signal processing tool that allows time frequency analysis. Furthermore, the processor circuitry 11 is arranged to determine whether a fault condition is present based on harmonic content of the field current frequency spectrum and harmonic content of the shaft voltage frequency spectrum, and to identify the type of fault condition.

The synchronous machine fault condition monitoring system 1 may optionally comprise a field voltage sensor 7c arranged to measure the field voltage of the rotor 5 and/or a temperature sensor 7d arranged to sense the temperature of the rotor 5. The temperature sensor 7d may for example be arranged on the exciter of the synchronous machine. The transmitter 9a is in this case arranged to receive field voltage signals measured by the field voltage sensor and/or temperature signals measured by the temperature sensor 7d, and to transmit these signals to the receiver 9b. The field voltage signal may for example be utilised together with the field current signal to determine the field impedance, which may be another fault condition indicator. The temperature signal may be utilised in conjunction with the harmonic content of the field current frequency spectrum and the shaft voltage frequency spectrum in order to determine the estimated lifetime of the rotor 5.

The present inventors have deduced a number of frequency spectra for the field current as well as the shaft voltage, characteristic for certain fault conditions in a synchronous machine. Some of these frequency spectra are unique for a certain fault condition, while for some fault conditions both the shaft voltage frequency spectrum obtained and the field current frequency spectrum obtained must be assessed in combination to be able to determine what type of fault condition is present.

Figure 2:
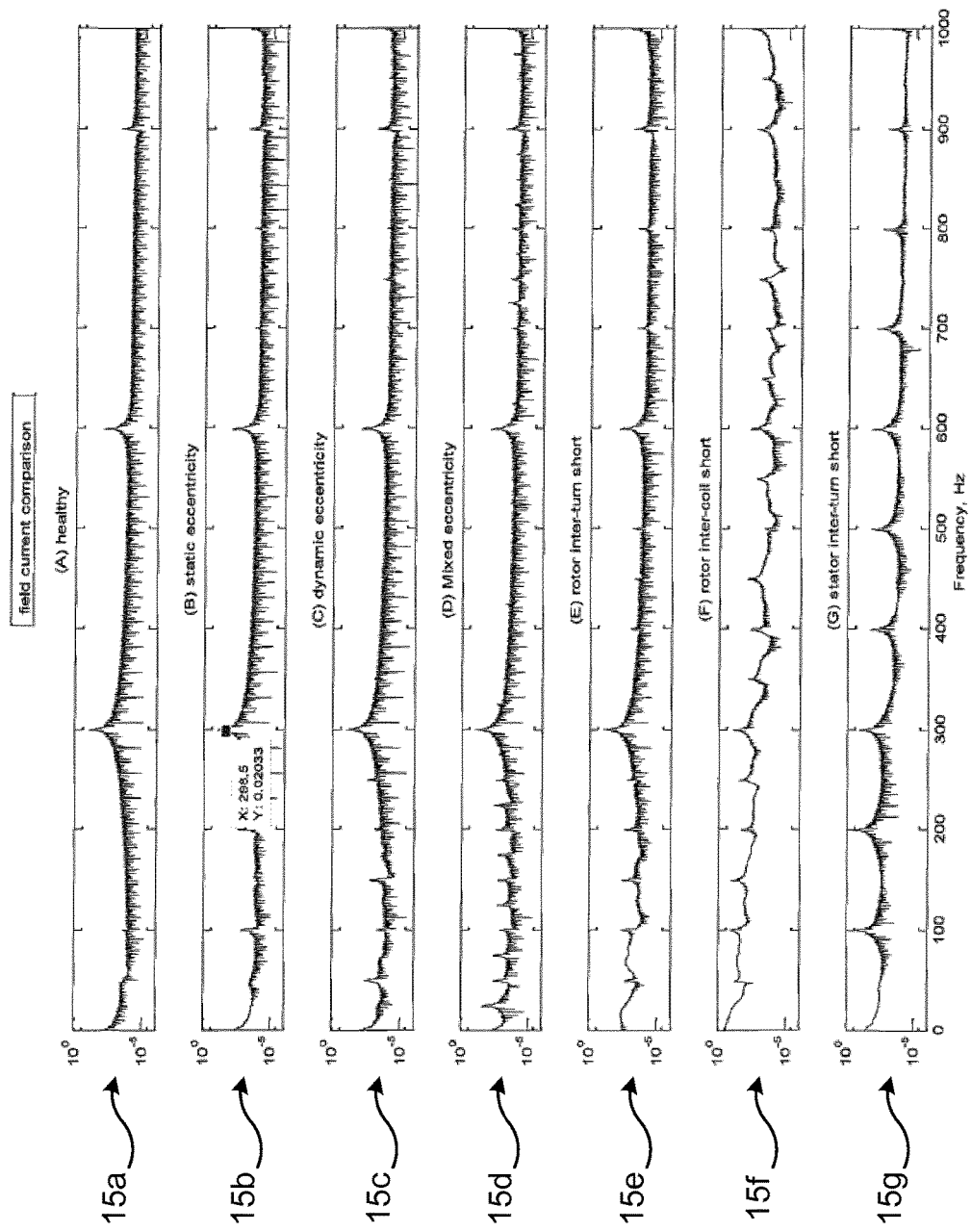
FIG. 2 depicts field current frequency spectra for a healthy condition and various fault conditions.

For the purpose of example FIG. 2 depicts a number of field current signature spectra 15a-15g. The uppermost frequency spectrum is a healthy condition field current signature spectrum 15a, which corresponds to the harmonic content of the field current frequency spectrum when a synchronous machine is healthy. The remaining field current signature spectra 15b-15g comprise harmonic content or frequency components which are characteristic of various fault conditions, but need not necessarily be unique. Thus, in certain situations information about the harmonic content of the field current frequency spectrum and the harmonic content of the shaft voltage harmonic spectrum must be assessed in combination to be able to determine the type of fault condition. In order to determine a static eccentricity fault condition, for example, it would be advantageous to utilise also the shaft voltage frequency spectrum obtained in conjunction with obtaining the field current frequency spectrum, in order to conclude that a static eccentricity fault condition is present, as will be described in more detail below.

Figure 3:
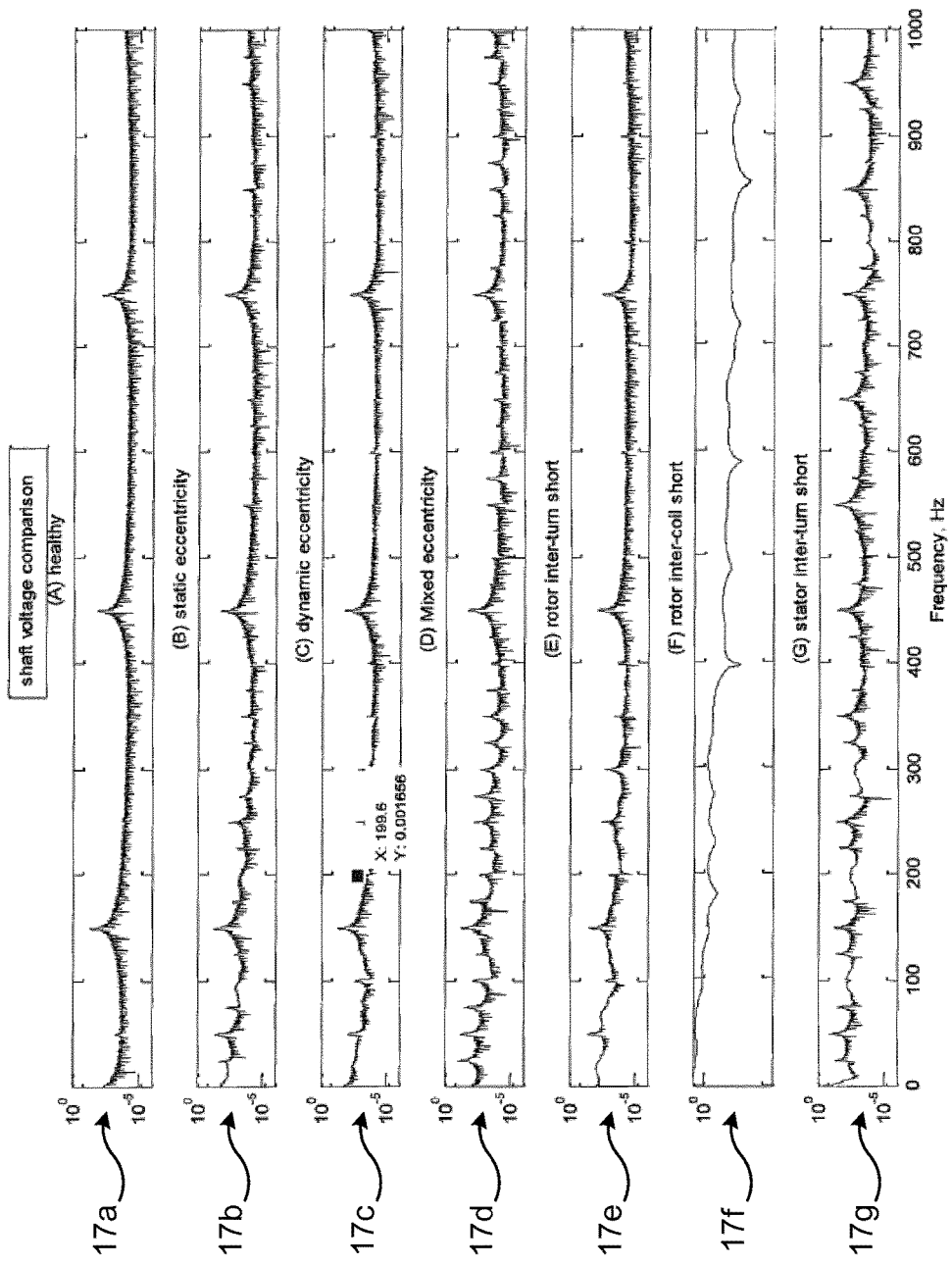
FIG. 3 depicts shaft voltage frequency spectra for a healthy condition and various fault conditions.

FIG. 3 depicts a number of shaft voltage signature spectra 17a-17g. The uppermost frequency spectrum is a healthy condition shaft voltage signature spectrum 15a, which corresponds to the harmonic content of the shaft voltage frequency spectrum when a synchronous machine is healthy. The remaining shaft voltage signature spectra 17b-17g comprise harmonic content or frequency components which are characteristic of various fault conditions, but need not necessarily be unique.

Table 1 below provides a list of distinguishing frequency components of the field current frequency spectrum and the shaft voltage frequency spectrum, and the corresponding fault condition. In the nomenclature of table 1 and also throughout this disclosure, n is an integer equal to or greater than 0, in particular the number of harmonic, $f_s$ is the supply frequency, for example 50 Hz, and $f_r$ is rotational frequency of the rotor of the synchronous machine.

| Fault condition | Field current ($I_f$) | Shaft voltage ($V_{sh}$) |
|---|---|---|
| Static eccentricity | Frequency component $2n*f_s$ Beyond 6th harmonic of $f_s$ not largely present | Frequency component $(2n + 1)*f_s \pm f_r$ Beyond $9^{th}$ harmonic fs not largely present |
| Dynamic eccentricity | Frequency component $n*f_s$ Beyond $6^{th}$ harmonic not largely present | Frequency component $n*f_s$ have more distinct frequency components compared to $I_f$ |
| Mixed eccentricity | frequency component $n*f_s$ Beyond $6^{th}$ harmonic of $f_s$ not largely present | Frequency component $n*f_r$ Has a wider presence even beyond $6^{th}$ harmonic of $f_s$ |
| Rotor shorted turn | Frequency component $n*f_s$ After $6^{th}$ harmonic only even harmonics are dominant, although odd harmonics are still present | Frequency component $n*f_s$ Frequency components are similar to If, existing up to $9^{th}$ harmonic of $f_s$ |
| Rotor shorted coil (extended case of rotor shorted turn where more turns are involved) | Frequency component $n*f_s$ The dominant frequency components extend well beyond $6^{th}$ harmonic of $f_s$ | Spectral components not distinctly featured in the signature |
| Stator shorted turn | Frequency components $2n*f_s$ Extend well beyond $6^{th}$ harmonic of $f_s$ for the entire frequency range | Frequency component $(2n + 1)*f_s \pm f_r$ The signature looks similar to the spectrum due to static eccentricity, but is more wide spread |

Figure 4:
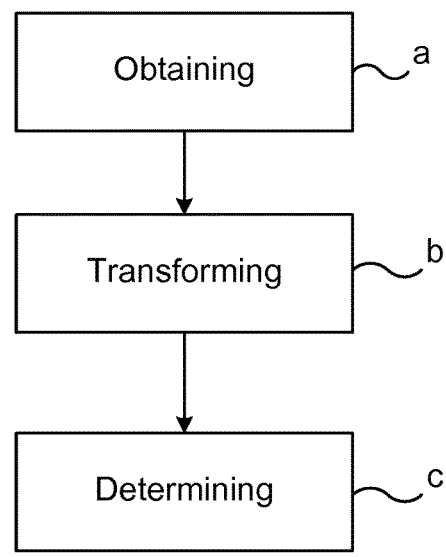
FIG. 4 is a flow chart of a method of determining a fault condition in a synchronous machine, which may be carried out by the synchronous machine fault condition monitoring system in FIG. 1 for example.

A method of determining a fault condition of a synchronous machine, as carried out by the synchronous machine fault condition monitoring system 1 will now be described with reference to FIG. 4.

In a step a) a field current signal and a shaft voltage signal of the synchronous machine are obtained by the processing circuitry 11.

In a step b) the field current signal is transformed to obtain a field current frequency spectrum. Moreover the shaft voltage signal is transformed to obtain a shaft voltage frequency spectrum. The field current signal and the shaft voltage signal, which when obtained by the processor circuitry typically are in the time domain, are transformed to the frequency domain by means of for example a Fourier transformer or another signal processing technique that allows time frequency analysis.

In a step c) it is determined by the processor circuitry 11 whether a fault condition is present and the type of the fault condition. The determining in step c) is based on the harmonic content of the field current frequency spectrum and the harmonic content of the shaft voltage frequency spectrum.

According to one variation in step c) the field current frequency spectrum obtained in step b) is compared with a healthy condition field current signature spectrum to determine whether a fault condition is present or not. Similarly, the shaft voltage frequency spectrum obtained in step b) is compared with a healthy condition shaft voltage signature spectrum. In case any of the field current frequency spectrum and the shaft voltage frequency spectrum deviates from the corresponding healthy condition signature spectrum, it is determined that a fault condition is present.

In case it is determined that a fault condition is present, i.e. if the harmonic content of the field current frequency spectrum does not match the healthy condition field current signature spectrum or the harmonic content of the shaft voltage frequency spectrum does not match the healthy condition shaft voltage signature spectrum, it is determined what type of fault condition is present. For this purpose, the harmonic content of the field current frequency spectrum is compared with fault condition field current signature spectra and the harmonic content of the shaft voltage frequency spectrum is compared with fault condition shaft voltage signature spectra. The type of fault condition may thus be determined by means of a matching fault condition field current signature spectrum and/or a matching fault condition shaft voltage signature spectrum.

Depending on the type of fault it may be necessary to combine the information obtained from the comparison of the field current frequency spectrum with fault condition field current signature spectra and comparisons of the shaft voltage frequency spectrum with fault condition shaft voltage signature spectra.

Generally, when evaluating the harmonic content of the field current frequency spectrum and the harmonic content of the shaft voltage frequency spectrum, the amplitude of the frequency components is a parameter on which step c) of determining whether a fault condition is present and identifying the type of fault condition is based. The amplitude of the frequency components thus depends on the type of the fault condition.

When it has been determined in step c) that a fault condition is present and its identity has been established, the synchronous machine fault condition monitoring system 1 may indicate that a fault condition is present, for example by displaying information on a display screen or by transmitting information to a mobile device, such as a smart phone, of an operator.

Examples of determining certain type of fault conditions will now be described. In particular, single fault conditions which may require a combination of information from both the field current frequency spectrum and the shaft voltage frequency spectrum will be described.

The first example relates to determining whether the fault condition is a stator shorted turn fault condition or a static eccentricity fault condition.

The processing circuitry 11 evaluates the field current frequency spectrum whether frequency components at $2n*f_s$ are present. Furthermore, the processing circuitry 11 evaluates the shaft voltage frequency spectrum whether frequency components at $(2n+1)*f_s \pm f_r$ are present. In case the frequency components $2n*f_s$ of the field current frequency spectrum are distributed in the entire spectrum and if frequency components at $(2n+1)*f_s \pm f_r$ in the shaft voltage frequency spectrum are present it is determined that a stator has a shorted turn, i.e. a stator shorted turn fault condition.

In case the frequency components $2n*f_s$ of the field current frequency spectrum are restricted to about the $6^{th}$ harmonic and if frequency components at $(2n+1)*f_s \pm f_r$ in shaft voltage frequency spectrum are present it is determined that a static eccentricity fault condition is present.

Another example where the field current frequency spectrum assessed may look similar to other fault conditions when considered alone and where the shaft voltage frequency spectrum may look similar to other fault conditions when considered alone is when determining whether a rotor has a shorted turn fault condition or whether a dynamic eccentricity fault condition is present. The processing circuitry 11 may thus evaluate the field current frequency spectrum whether frequency components at $n*f_s$ are present, and evaluate the shaft voltage frequency spectrum whether frequency components at $n*f_s$ are present to thereby determine whether a rotor has a shorted turn fault condition, i.e. a rotor shorted turn fault, or whether a dynamic eccentricity fault condition is present. When considering both spectra together, it may be determined what type of fault condition is present.

Thus, in the above cases, harmonic content from both the field current frequency spectrum and the shaft voltage frequency spectrum are utilised to determine the type of fault condition.

As an alternative to determine that a rotor has a shorted turn fault condition it may be evaluated whether frequency components at $2n*f_s$ are present beyond the $6^{th}$ harmonic of the field current frequency spectrum. If that is the case, it can be determined that a rotor has a shorted turn fault condition.

The presence of a static and dynamic eccentricity fault condition, i.e. a mixed fault conditions may be determined by the processing circuitry 11, evaluating the field current frequency spectrum whether frequency components at $n*f_r$ are present. If they are, the processing circuitry 11 is able to conclude that a mixed fault condition is present.

Additional types of fault conditions and the characteristics or signatures of these fault conditions are summarised in table 1 hereabove and the corresponding fault condition frequency spectra are shown in FIGS. 2 and 3.

It is envisaged that the system and method presented herein may be utilised in a smart synchronous machine environment to diagnose fault conditions of the synchronous machine, and to estimate the lifetime of the synchronous machine. By means of the system and method, it may be possible to determine fault conditions of a synchronous machine and to estimate when a complete breakdown of the synchronous machine would occur if a fault condition is not handled properly. The synchronous machine fault condition monitoring system and method may be utilised in conjunction with synchronous generators and synchronous motors, involving any voltage levels utilised by such machines.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:
1. A method of determining a fault condition in a synchronous machine, wherein the method comprises:
   a) obtaining a field current signal of a current flowing through a rotor coil and a shaft voltage signal of the synchronous machine, b) transforming the field current signal and the shaft voltage signal to obtain a field current frequency spectrum and a shaft voltage frequency spectrum, and c) determining whether a fault condition is present, and in case a fault condition is present identifying a type of the fault condition, wherein the determining is based on harmonic content of the field current frequency spectrum and harmonic content of the shaft voltage frequency spectrum, wherein step c) comprises comparing the harmonic content of the field current frequency spectrum with the harmonic content of a healthy condition field current signature spectrum and the harmonic content of the shaft voltage frequency spectrum with the harmonic content of a healthy condition shaft voltage signature spectrum, wherein in case the harmonic content of the field current frequency spectrum does not match the harmonic content of the healthy condition field current signature spectrum or the harmonic content of the shaft voltage frequency spectrum does not match the harmonic content of the healthy condition shaft voltage signature spectrum, step c) comprises comparing the harmonic content of the field current frequency spectrum with the harmonic content of fault condition field current signature spectra and comparing the harmonic content of the shaft voltage frequency spectrum with the harmonic content of fault condition shaft voltage signature spectra.

2. The method as claimed in claim 1, wherein in step c) identification of the type of fault condition is further based on the amplitude of frequency components of the harmonic content of the field current frequency spectrum and the shaft voltage frequency spectrum.

3. The method as claimed in claim 1, comprising evaluating the field current frequency spectrum whether frequency components at $2n*f_s$ are present, where n is an integer and $f_s$ is a supply frequency.

4. The method as claimed in claim 3, comprising determining whether frequency components at $2n*f_s$ are present beyond the $6^{th}$ harmonic to determine that a rotor has a shorted turn fault condition.

5. The method as claimed in claim 3, comprising evaluating the shaft voltage frequency spectrum whether frequency components at $(2n+1)*f_s \pm f_r$ are present, where $f_r$ is a rotational frequency of a rotor of the synchronous machine.

6. The method as claimed in claim 5, comprising determining that a stator has a shorted turn in case the frequency components $2n*f_s$ of the field current frequency spectrum are distributed in the entire spectrum and if frequency components at $(2n+1)*f_s \pm f_r$ in shaft voltage frequency spectrum are present.

7. The method as claimed in claim 5, comprising determining that a static eccentricity fault condition is present in case the frequency components $2n*f_s$ of the current voltage frequency spectrum are restricted to about the $6^{th}$ harmonic and if frequency components at $(2n+1)*f_s \pm f_r$ in the shaft voltage frequency spectrum are present.

8. The method as claimed in claim 1, comprising evaluating the field current frequency spectrum whether frequency components at $n*f_r$ are present, where n is an integer and $f_r$ is a rotational frequency of a rotor of the synchronous machine, to determine whether a static and dynamic eccentricity fault condition is present.

9. The method as claimed in claim 1, comprising evaluating the field current frequency spectrum whether frequency components at $n*f_s$ are present, and evaluating the shaft voltage frequency spectrum whether frequency components at $n*f_s$ are present where n is an integer and $f_s$ is a supply frequency, to determine whether a rotor has a shorted turn fault condition or whether a dynamic eccentricity fault condition is present.

10. The method as claimed in claim 1, comprising obtaining the field current signal from a field current sensor and the shaft voltage signal from a shaft voltage sensor.

11. A computer program product comprising computer-executable components for causing a synchronous machine fault condition monitoring system to perform the method as claimed in claim 1 when the computer-executable components are run on processor circuitry of the synchronous machine fault condition monitoring system.

12. A synchronous machine fault condition monitoring system comprising:
  a field current sensor arranged to measure a field current of a synchronous machine,
  a shaft voltage sensor arranged to measure a shaft voltage of a synchronous machine, processor circuitry arranged to receive a field current signal from the field current sensor and a shaft voltage signal from the shaft voltage sensor, and
  a storage unit storing instructions that, when executed by the processor circuitry causes the synchronous machine fault condition monitoring system to perform the method comprises:
  a) obtaining a field current signal of a current flowing through a rotor coil and a shaft voltage signal of the synchronous machine,
  b) transforming the field current signal and the shaft voltage signal to obtain a field current frequency spectrum and a shaft voltage frequency spectrum, and
  c) determining whether a fault condition is present, and in case a fault condition is present identifying a type of the fault condition, wherein the determining is based on harmonic content of the field current frequency spectrum and harmonic content of the shaft voltage frequency spectrum,
  wherein step c) comprises comparing the harmonic content of the field current frequency spectrum with the harmonic content of a healthy condition field current signature spectrum and the harmonic content of the shaft voltage frequency spectrum with the harmonic content of a healthy condition shaft voltage signature spectrum,
  wherein in case the harmonic content of the field current frequency spectrum does not match the harmonic content of the healthy condition field current signature spectrum or the harmonic content of the shaft voltage frequency spectrum does not match the harmonic content of the healthy condition shaft voltage signature spectrum, step c) comprises comparing the harmonic content of the field current frequency spectrum with the harmonic content of fault condition field current signature spectra and comparing the harmonic content of the shaft voltage frequency spectrum with the harmonic content of fault condition shaft voltage signature spectra.

* * * * *